US009570419B2

(12) United States Patent
Tan

(10) Patent No.: US 9,570,419 B2
(45) Date of Patent: Feb. 14, 2017

(54) METHOD OF THINNING AND PACKAGING A SEMICONDUCTOR CHIP

(71) Applicant: Infineon Technologies AG, Neubiberg (DE)

(72) Inventor: Aik Teong Tan, Melaka Baru (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/606,274

(22) Filed: Jan. 27, 2015

(65) Prior Publication Data

US 2016/0218080 A1   Jul. 28, 2016

(51) Int. Cl.
| | |
|---|---|
| H01L 21/00 | (2006.01) |
| H01L 23/02 | (2006.01) |
| H01L 23/00 | (2006.01) |
| H01L 23/498 | (2006.01) |
| H01L 23/495 | (2006.01) |
| H01L 23/48 | (2006.01) |
| H01L 25/065 | (2006.01) |

(52) U.S. Cl.
CPC ............ *H01L 24/97* (2013.01); *H01L 23/481* (2013.01); *H01L 23/4951* (2013.01); *H01L 23/49805* (2013.01); *H01L 24/95* (2013.01); *H01L 25/065* (2013.01); *H01L 23/49575* (2013.01)

(58) Field of Classification Search
CPC .............................. H01L 24/97; H01L 23/4951
USPC .................................. 438/108–113; 257/686
See application file for complete search history.

(56) References Cited

U.S. PATENT DOCUMENTS

| | | | | |
|---|---|---|---|---|
| 7,867,878 B2* | 1/2011 | Brunnbauer | ............ | H01L 24/96 438/459 |
| 8,143,108 B2* | 3/2012 | Pendse | .................. | H01L 21/563 438/125 |
| 8,823,155 B2* | 9/2014 | Nakasaki | ............ | H01L 21/6836 257/522 |
| 8,853,003 B2* | 10/2014 | Xue | .................... | H01L 23/3114 257/621 |

(Continued)

FOREIGN PATENT DOCUMENTS

| | | |
|---|---|---|
| JP | 2014107508 A | 6/2014 |
| JP | 2014529182 A | 10/2014 |

OTHER PUBLICATIONS

Unknown, Author, "DISCO at SEMI Networking Day", DISCO Corporation, Jun. 27, 2013, pp. 1-5.

*Primary Examiner* — Calvin Lee
(74) *Attorney, Agent, or Firm* — Murphy, Bilak & Homiller, PLLC

(57) ABSTRACT

A semiconductor wafer and a plurality of semiconductor dies are provided. The wafer and the dies each include first electrically conductive terminals arranged on a main surface. The wafer is permanently attached to each of the semiconductor dies such that the first terminals are electrically connected to one another. At least one of the wafer and the semiconductor dies is thinned. The wafer is diced so as to form a plurality of chip-stacks, each of the chip-stacks comprising one of the semiconductor dies permanently attached to a diced wafer chip. At least one of the first terminals in the chip-stack is accessible by a second electrically conductive terminal arranged on a rear surface and electrically connected to the first terminal by an electrical connector that is internal to a semiconductor body of either the semiconductor die or the diced wafer chip of the chip-stack.

18 Claims, 13 Drawing Sheets

(56) References Cited

U.S. PATENT DOCUMENTS

2012/0040510 A1    2/2012  Yoo
2012/0153467 A1*  6/2012  Chi ........................ H01L 21/78
                                                        257/737

* cited by examiner

METHOD OF THINNING AND PACKAGING A SEMICONDUCTOR CHIP

TECHNICAL FIELD

The instant application relates to semiconductor processing techniques and corresponding devices, and more particularly relates to methods of forming ultra-thin semiconductor chips.

BACKGROUND

Semiconductor technology is utilized to form integrated circuit devices for a wide variety of applications. Typically in semiconductor technology, one or more functional devices are formed within a semiconductor body. Examples of these functional devices include Metal Oxide Semiconductor Field Effect Transistors (MOSFETs), Bipolar-Junction-Transistors (BJTs), diodes, thyristors, etc. A single integrated circuit may include any number of functional devices (e.g., one, ten, thousands, millions, etc.) that are collectively configured to provide a desired digital or analog configuration, e.g., CMOS logic, power switching, analog amplification, etc.

One aspect of semiconductor technology that designers are constantly seeking to improve is the thickness of the semiconductor body that is used to form functional devices. Reducing chip thickness can provide advantageous performance benefits for the integrated circuit, such as improved on-resistance ($R_{ON}$) and better heat dissipation. However, known semiconductor manufacturing techniques are currently limited in their capability to reduce chip thickness below certain levels, e.g., below 100 μm, because, as a semiconductor substrate becomes thinner, it becomes more brittle and susceptible to breakage. These breaks are not correctible and therefore require the device to be discarded. Accordingly, there is a need to provide reduced semiconductor chip thickness in a reliable and cost-effective manner.

SUMMARY

A method of forming a semiconductor device is disclosed. According to an embodiment, the method includes providing a semiconductor wafer and a plurality of semiconductor dies. The wafer and the dies each include first electrically conductive terminals arranged on a main surface. The wafer is permanently attached to each of the semiconductor dies, with the respective main surfaces of the semiconductor dies facing the main surface of the wafer, such that the first terminals of the semiconductor dies are electrically connected to the first terminals of the semiconductor wafer. At least one of the wafer, and each of the semiconductor dies is thinned. The wafer is diced after permanently attaching so as to form a plurality of chip-stacks. Each of the chip-stacks include one of the semiconductor dies permanently attached to a diced wafer chip. At least one of the first terminals in the chip-stack is accessible by a second electrically conductive terminal arranged on a rear surface that is opposite to one of the main surfaces in the chip-stack. The second terminal is electrically connected to the at least one of the first terminals by an electrical connector that is internal to a semiconductor body of either the semiconductor die or the diced wafer chip of the chip-stack.

A method of processing a wafer and plurality semiconductor dies, with either the wafer or the semiconductor dies being configured as a flip-chip, is disclosed. According to an embodiment, the method includes permanently attaching the wafer to each of the semiconductor dies in a flip-chip configuration such that main surfaces of the semiconductor dies face a main surface of the wafer and such that first terminals of the semiconductor dies are electrically connected to first terminals of the semiconductor wafer. At least one of the wafer, and each of the semiconductor dies is thinned. The wafer is diced after permanently attaching so as to form a plurality of chip-stacks, each of the chip-stacks including one of the semiconductor dies and a diced wafer chip. The chip-stacks are packaged. Packaging the chip-stacks includes electrically connecting a package-level terminal to a second terminal of the chip-stack, the second terminal being arranged on a rear surface that is opposite to one of the main surfaces in the chip-stack and being connected to one of the first terminals in the chip-stack by an electrical connector that is internal to a semiconductor body of either the semiconductor die or the diced wafer chip of the chip-stack. Packaging the chip-stacks further includes encapsulating the chip-stack with an electrically insulating material.

A chip-stack is disclosed. According to an embodiment, the chip-stack includes a thinner semiconductor chip including first electrically conductive terminals arranged on a main surface of a semiconductor body and a functional device arranged in the semiconductor body. The chip-stack further includes a thicker semiconductor chip including first electrically conductive terminals arranged on a main surface of a semiconductor body, a second electrically conductive terminal arranged on a rear surface of the thicker semiconductor chip that is opposite the main surface of the thicker semiconductor chip, and an electrical connector that is internal to the semiconductor body of the thicker semiconductor chip and connected to the first and second terminals of thicker semiconductor chip. The chip-stack further includes a permanent and electrically conductive connection between the first terminals of the thinner and thicker semiconductor chips. The main surfaces of the thinner and thicker semiconductor chips face one another. At least one of the first terminals of the thinner semiconductor chip is electrically accessible by the second terminal of the thicker semiconductor chip. A thickness of the thinner semiconductor chip is less than or equal to 40 μm.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
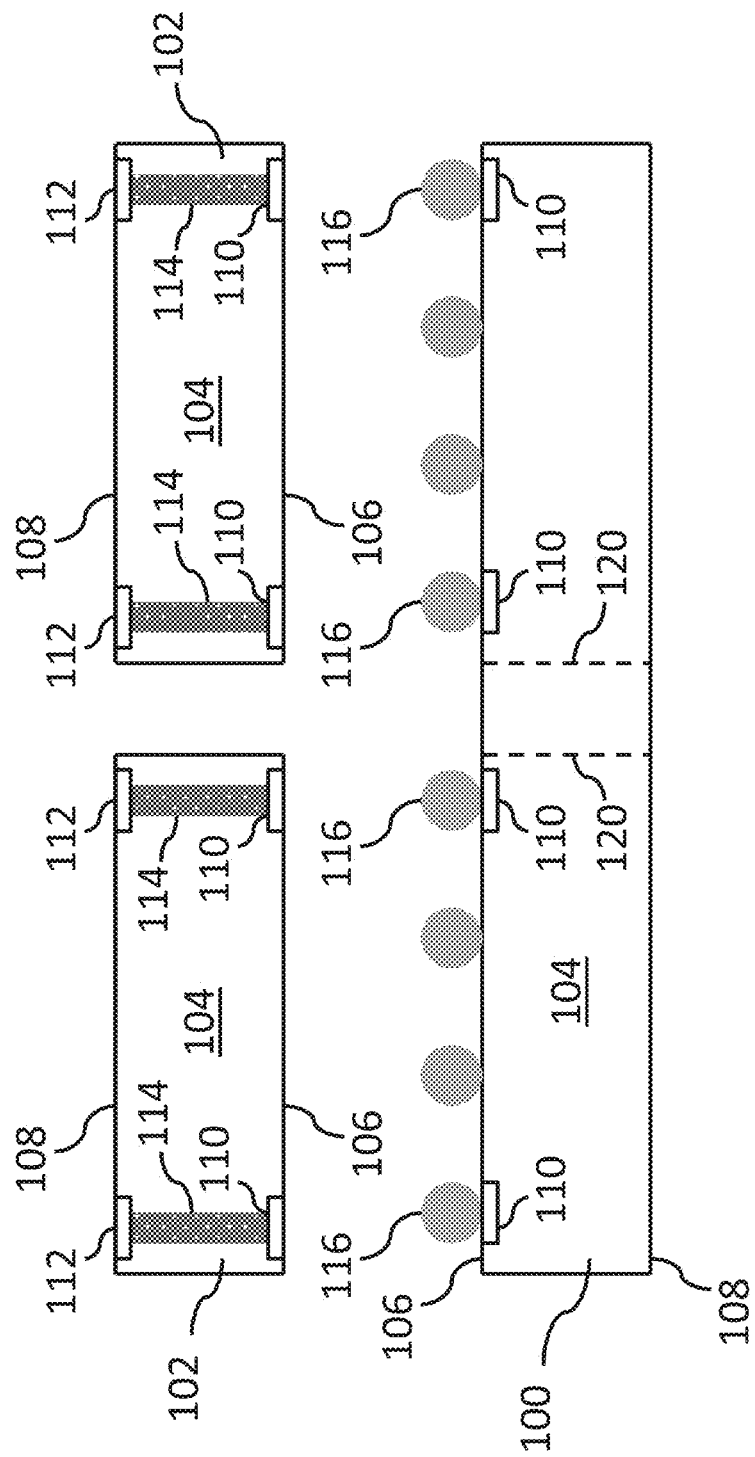
FIG. 1 depicts a method step of providing a semiconductor wafer configured with flip-chips and a plurality of semiconductor dies configured as electrical conduits, according to an embodiment.

The embodiments described herein include a method of forming a semiconductor device. According to the method, a semiconductor wafer and a plurality of semiconductor dies are permanently attached to one another, e.g., by soldering. After the attachment process, a thinning process is performed on either the wafer or the semiconductor dies. Whichever one of the wafer or semiconductor dies that is thinned can have functional devices formed therein and therefore be utilized in an ultra-thin, high-performance semiconductor device. After thinning, the wafer can be diced into individual semiconductor chips so as to form a plurality of chip-stacks, with each of the chip-stacks including a thinner semiconductor chip and a thicker semiconductor chip. Although the ultra-thin chips are covered by the thicker chip in the chip-stack, electrical access to the functional devices in the ultra-thin chips is nonetheless made possible by the provision of internal connectors in the thicker chip that act as electrical conduits to the terminals of the ultra-thin chips.

The methods described herein advantageously allow for the formation of ultra-thin, high-performance chip with a low substrate thickness that is not otherwise achievable by known process techniques. For instance, the thinner chip in the chip stack can have a thickness of less than or equal to 40 µm, and may be 20 µm thick, according to one embodiment. These reduced thicknesses provide improved characteristics (e.g., improved $R_{ON}$, better heat dissipation, etc.) in comparison to chip thicknesses that are achievable by conventional techniques, such as thicknesses greater than 50 µm. Thicknesses of less than or equal to 40 µm are not achievable using conventional techniques because it is impossible to process wafer that is used to form these chips and/or process the chips after dicing. For example, processing steps such as die-attach, wire bonding, etc., on chips that are less than or equal to 40 may not be possible without causing cracks, voids or warpages to propagate in the substrate.

Advantageously, the attachment of a thicker semiconductor chip (or wafer) to the thinned chip (or wafer) according to the methods described herein allows for processing steps to be carried out on the device without placing the thinned chip (or wafer) at risk. The thicker semiconductor chip (or wafer) can be handled by a robotic arm during process steps such as wafer thinning, device fabrication, die-attach, wire bonding, etc. Consequently, no mechanical pressure is applied to the thinned chip (or wafer), which has or will have the functional devices, during these process steps. Thus, the likelihood of cracks, voids or warpages propagating in the thinned chip (or wafer), which has or will have the functional devices, is mitigated or even eliminated. Further, the thicker semiconductor chip (or wafer) can be formed without any functional devices that are essential to the particular application. Thus, even if cracks, voids or warpages occur in the thicker semiconductor chip (or wafer) during processing, the functionality of the ultra-thin chip (or wafer) and remains intact and the device is suitable for the particular application.

Referring to FIG. 1, a semiconductor wafer 100 and a plurality (i.e., two or more) of semiconductor dies 102 are provided. The semiconductor wafer 100 is formed from a semiconductor body 104 that is defined by a main surface 106 and a rear surface 108 that is opposite the main surface 106. A thickness of the wafer 100 can be defined as a distance between the main and rear surfaces 106, 108 of the semiconductor body 104 in a direction perpendicular to these surfaces 106, 108. Likewise, the semiconductor dies 102 are formed from a semiconductor body 104 that is defined by a main surface 106 and a rear surface 108 that is opposite the main surface 106. A thickness of the semiconductor dies 102 can be defined as a distance between the main and rear surfaces 106, 108 of the semiconductor body 104 in a direction perpendicular to these surfaces 106, 108.

The wafer 100 and the dies 102 each include first electrically conductive terminals 110 arranged on the main surface 106. For example, the wafer 100 and the dies 102 may each include bonding pads formed from copper, aluminum or other electrically conductive metals.

The wafer 100 includes functional devices integrated in the semiconductor body 104. These functional devices may be any of a variety of functional devices, such as, MOSFETs, BJTs, diodes, etc. Further, these functional devices may have any one of a variety of orientations, relative to the semiconductor body. For example, the functional devices may be configured to control a channel that flows in a direction parallel to the main surface (i.e., as lateral devices) or in a direction perpendicular to the main surface (i.e., as a vertical device).

The first terminals 110 of the wafer 100 are connected to the functional devices and provide input/output access to the functional devices. The functional devices and the first terminals 110 of the wafer 100 are configured in a unit-cell format such that the wafer can be diced into a plurality of singulated semiconductor chips, with each chip having the same configuration and same functionality.

The semiconductor dies 102 further include second electrically conductive terminals 112 arranged on a rear surface 108 that is opposite from the main surface 106 of the semiconductor dies 102. The second terminals 112 are electrically connected to the first terminals 110 of the dies 102 by an electrical connector 114 that is arranged within the semiconductor body 104 of the semiconductor dies 102. According to an embodiment, the electrical connector 114 is configured as a through-silicon-via (TSV).

The semiconductor dies 102 may include, but do not necessarily include, functional devices integrated into the semiconductor body 104 of the semiconductor dies 102. For example, the semiconductor dies 102 may be configured as purely passive devices in which the electrical connector 114 is a passive wire connection formed within a bulk semiconductor material that is devoid of any intentionally formed active devices. Alternatively, the electrical connector 114 may be provided by a functional device, such as vertical transistor, in the semiconductor body 104 of the semiconductor dies 102. In addition or in the alternative, the semiconductor dies 102 may include one or more active components, such as a MOSFETs, BJT, diode, etc., in addition to the electrical connectors 114.

The wafer 100 and the dies 102 are arranged such that the respective main surfaces 106 of the semiconductor dies 102 face the main surface 106 of the wafer 100. That is, the wafer 100 and the dies 102 are arranged such that the first terminals 110 of the wafer 100 and the dies 102 face one another and such that the second electrically conductive terminals 112 of the semiconductor dies 102 face away from the wafer 100. Further, the wafer 100 includes solder balls 116 formed on the first surface 106 and in electrical contact with the first terminals 110. In other words, the wafer 100 has a flip-chip configuration with a plurality of flip-chips that can each be individually mated with one of the semiconductor dies 102.

Figure 2:
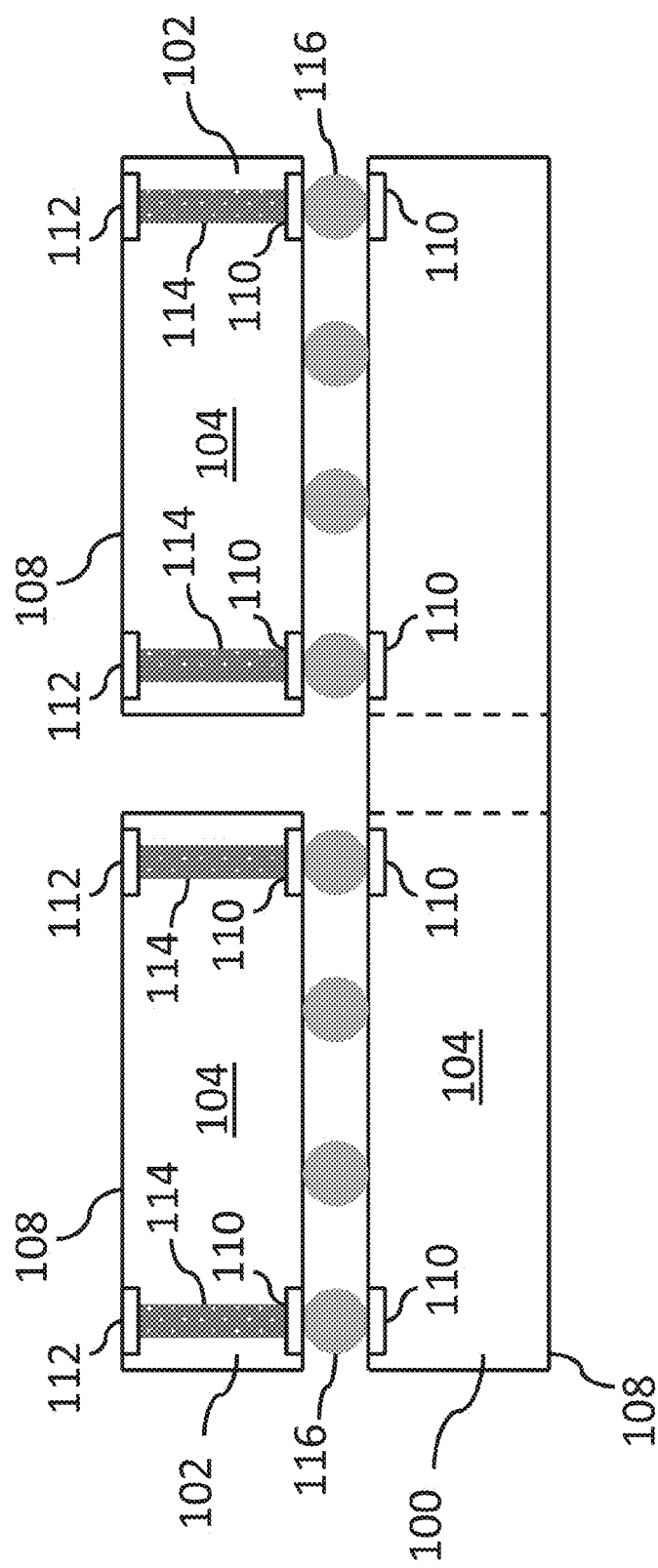
FIG. 2 depicts permanently attaching the wafer of FIG. 1 to each of the semiconductor dies, according to an embodiment.

Referring to FIG. 2, the wafer 100 is permanently attached to each of the semiconductor dies 102 such that the first terminals 110 of the semiconductor dies 102 are electrically connected to the first terminals 110 of the semiconductor wafer 100. According to an embodiment, the permanent attachment and electrical connection is done by mechanically pressing the semiconductor dies 102 together with the wafer 100 and subsequently soldering the respective first terminals 110 of the semiconductor dies 102 and the semiconductor wafer 100 together using the solder balls 116. Any of a variety of soldering techniques may be utilized, such as thermosonic bonding or reflow soldering. As a result, the solder electrically connects and physically couples the semiconductor dies 102 and the wafer 100 together.

Figure 3:
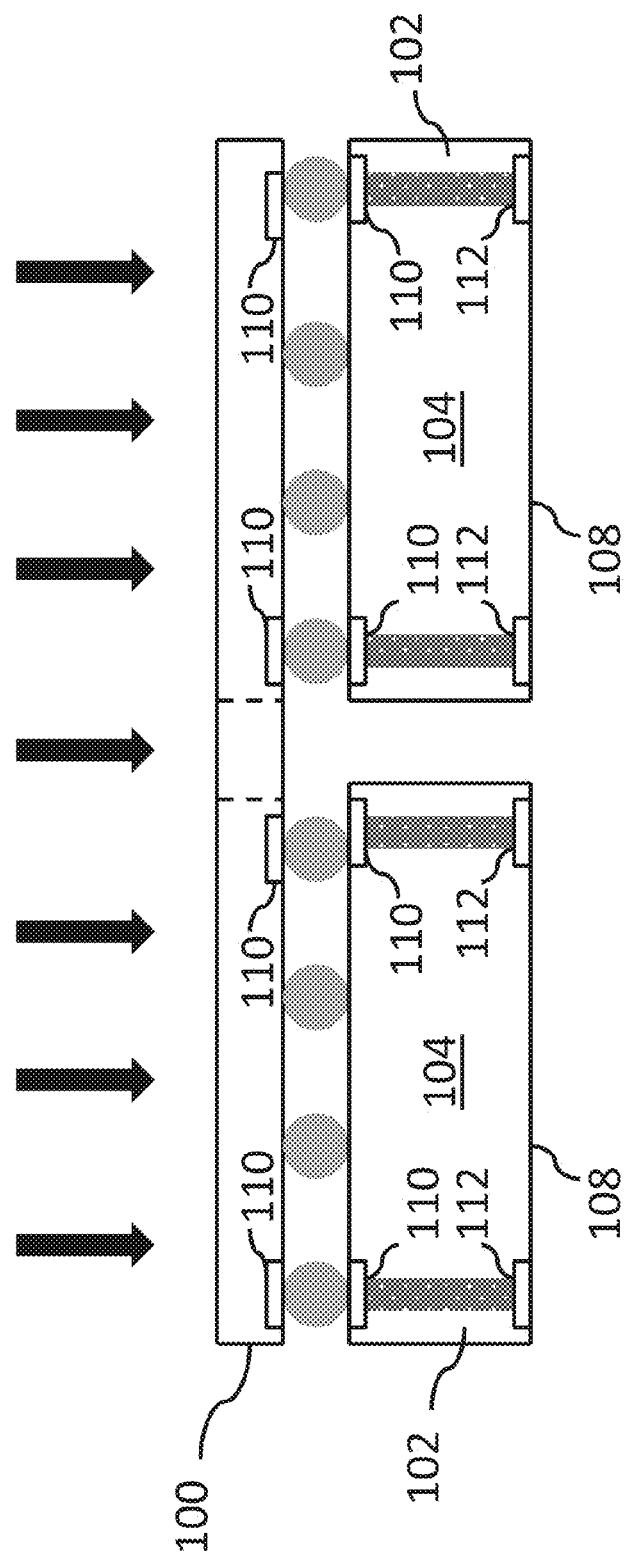
FIG. 3 depicts thinning the wafer of FIG. 1, according to an embodiment.

Referring to FIG. 3, a thinning process is performed at the rear surface 108 of the wafer 100. The wafer 100 may be thinned according to any of a variety of techniques such as mechanical grinding, chemical mechanical polishing (CMP), wet etching and atmospheric downstream plasma (ADP) dry chemical etching (DCE), etc. According to an embodiment, the wafer 100 is thinned by grinding or plasma etching semiconductor material away from the rear surface 108 of the wafer. The wafer 100 may have a thickness of at least 200 µm before thinning and less than or equal to 40 µm after thinning.

Figure 4:
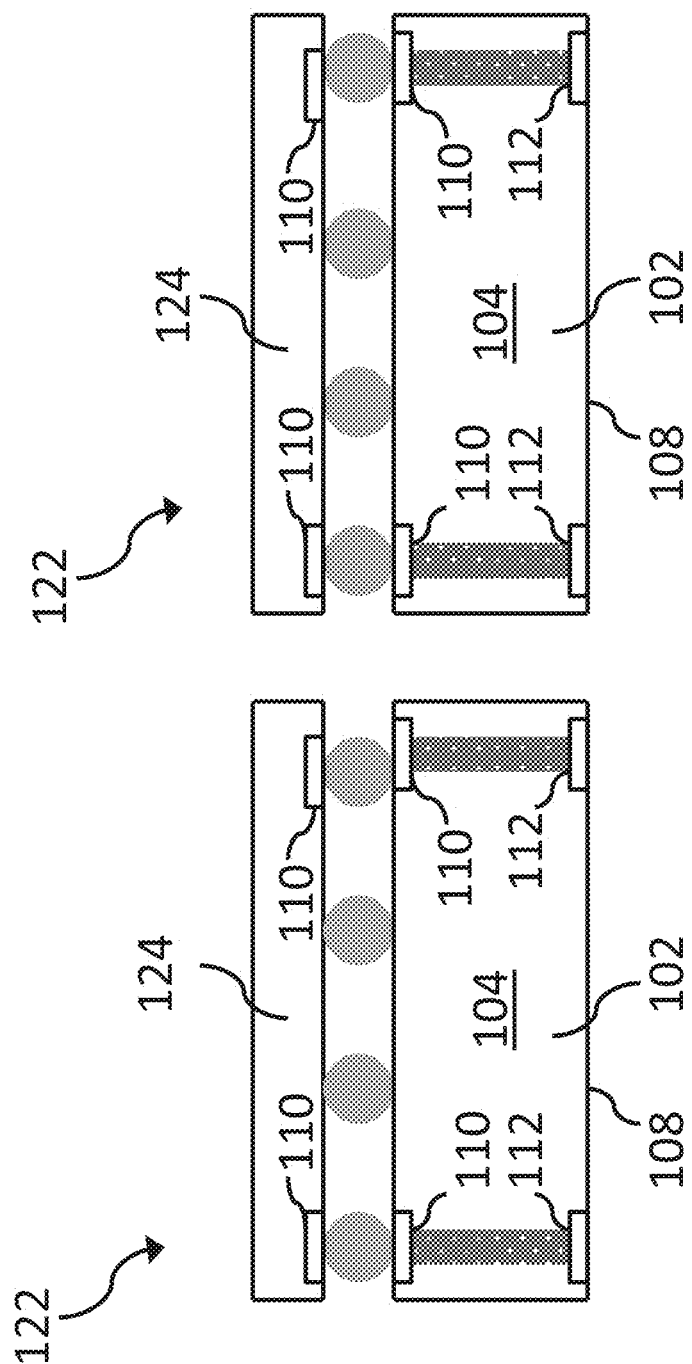
FIG. 4 depicts dicing the wafer of FIG. 1 after permanently attaching so as to form a plurality of chip-stacks, according to an embodiment.

Referring to FIG. 4, after permanently attaching the wafer 100 to each of the semiconductor dies 102, the wafer 100 is diced. For example, the wafer 100 may include scribe lines 120 as depicted in FIG. 1 and the dicing process may consist of mechanically breaking the wafer 100 along the scribe lines 120. Alternatively, the wafer 100 may be diced by other techniques such as sawing or laser cutting. The wafer 100 is diced so as to form a plurality of chip-stacks 122, with each of the chip-stacks 122 including one of the semiconductor dies 102 permanently attached to a diced wafer chip 124. That is, the individual unit cells of the wafer 100 are singulated from one another to form a plurality of the diced wafer chips 124, which are attached to one of the semiconductor dies 102.

Figure 5:
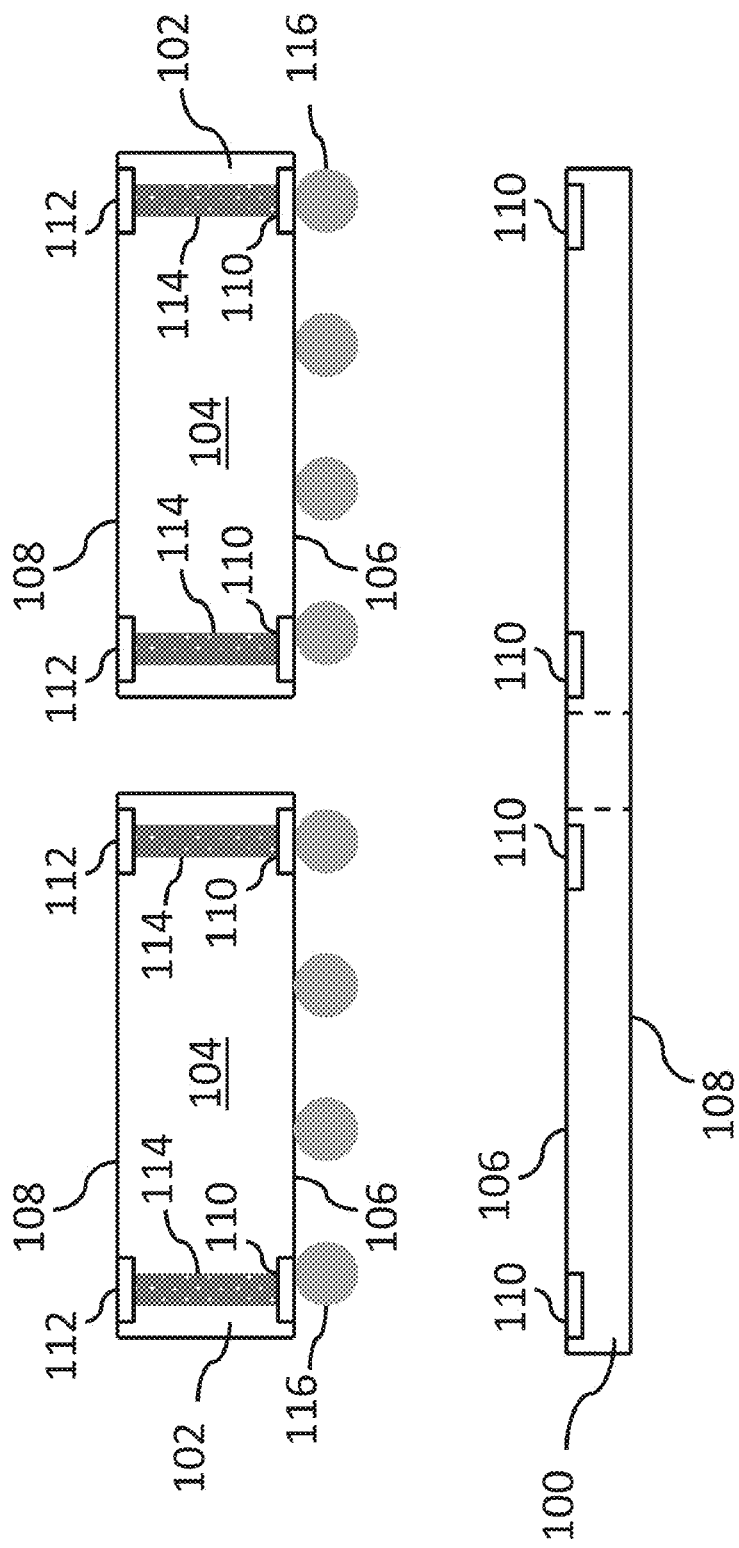
FIG. 5 depicts a method of providing a pre-thinned semiconductor wafer and a plurality of semiconductor dies, according to an embodiment.
Figure 6:
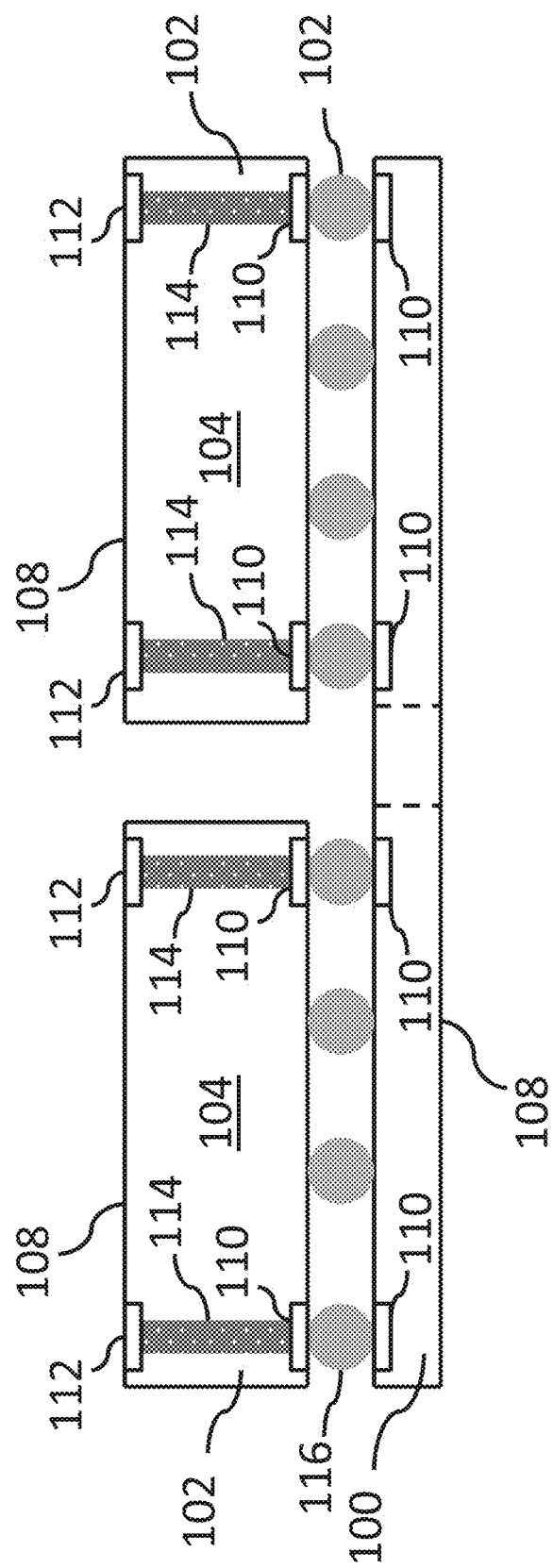
FIG. 6 depicts permanently attaching the pre-thinned wafer of FIG. 5 to each of the semiconductor dies, according to an embodiment.

FIGS. 5-6 depict an alternate embodiment to the method of FIGS. 1-4 in which the order of permanently attaching (depicted in FIG. 2) and thinning (depicted in FIG. 3) is reversed. Referring to FIG. 5, the semiconductor wafer 100 and the plurality of semiconductor dies 102 are provided. The wafer 100 has previously been thinned, e.g., in the manner previously discussed with reference to FIG. 3 (mechanical grinding, chemical etching, etc.). As a result, the wafer 100 may have a thickness of below 40 µm, such as 20 µm. Referring to FIG. 6, after thinning, the wafer 100 is permanently attached to the semiconductor dies 102. This may be done by mechanically pressing the semiconductor dies 102 with the wafer 100 and subsequently soldering the two together using the solder balls 116. The dicing step previously discussed may be performed on the wafer 100 so as to form the chip-stacks 122.

Due to the flip-chip configuration of the chip-stacks 122, the first terminals 110 in the chip-stacks 122 are not electrically accessible. In other words, it is not possible to form a bonding wire on one the first terminals 110 because these terminals are covered by the opposite facing chip in the chip-stack 122. However, electrical access to the first terminals 110 in the chip-stacks 122 can nonetheless be made possible by the provision of the second electrically conductive terminals 112 at an outer surface of the chip-stacks 122 that are readily accessible by an external connection. When the first terminals 110 of the semiconductor dies 102 are soldered to the first terminals 110 of the semiconductor wafer 100 in the manner previously discussed, the second terminals 112 that are arranged on the semiconductor dies 102 are electrically connected to the first terminals 110 of the wafer 100, via the internal connector 114. As a result, at least one of the first terminals 110 in the chip-stack is accessible by a second electrically conductive terminal 112 arranged on a rear surface 108 that is opposite to one of the main surfaces 106 in the chip-stack 122. The configuration and arrangement of the second terminals 112 may be tailored such that the chip-stack 122 is compatible with any different kind of package type, e.g., flip-chip, leadless, lead-frame, etc. In addition or in the alternative, the wafer 100 may also include the second terminals 112 and the electrical connector 114 so as to make one of the first terminals 110 electrically accessible at a rear surface 108 of the diced wafer chip 124.

Figure 7:
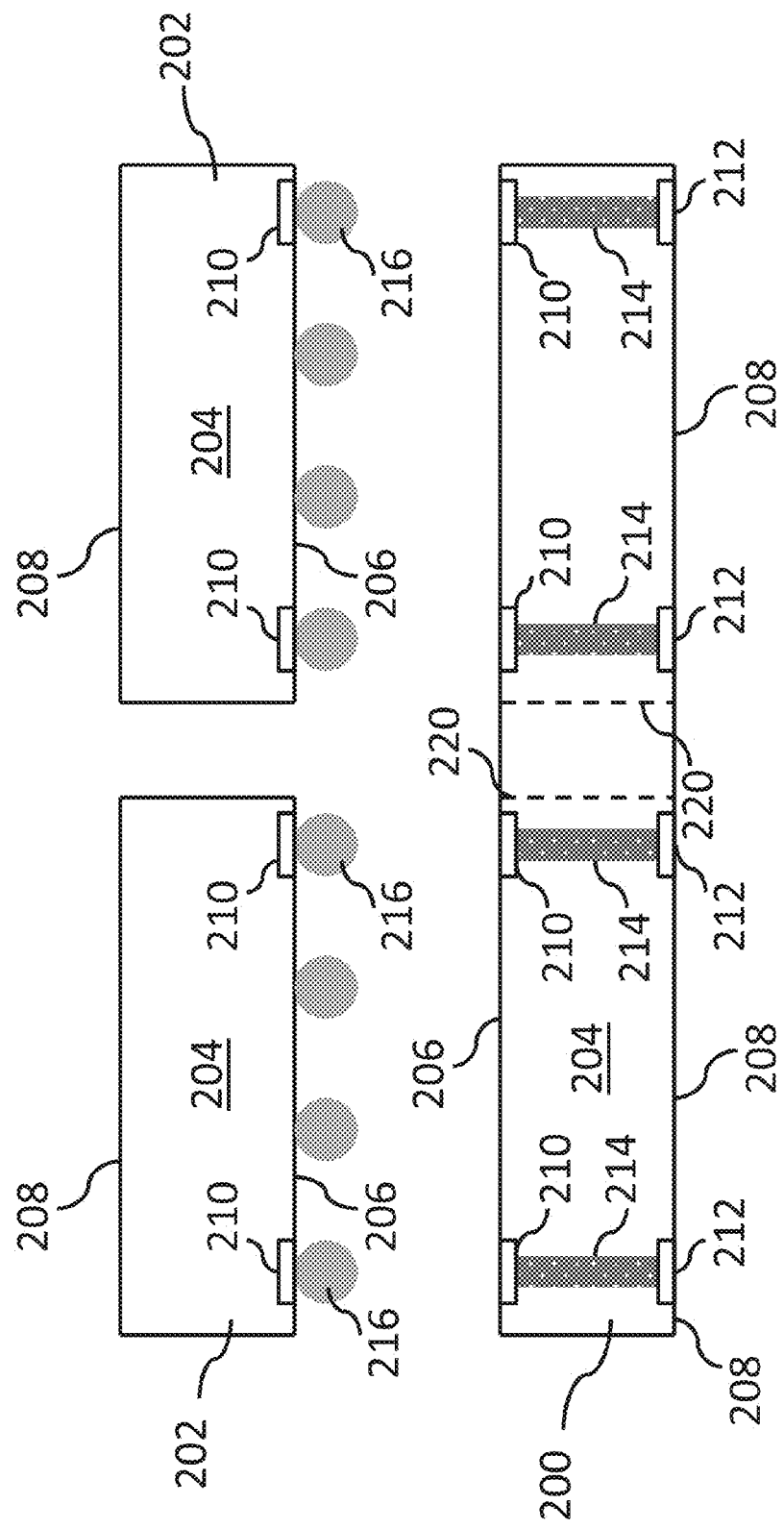
FIG. 7 a method step of providing a semiconductor wafer configured with electrical conduits and a plurality of semiconductor dies configured with flip-chips, according to an embodiment.

FIGS. 7-10 depict a method of forming a plurality of chip-stacks, according to another embodiment. Referring to FIG. 7, a semiconductor wafer 200 and a plurality of semiconductor dies 202 are provided. Both the wafer 200 and the dies 202 have a semiconductor body 204 that that is defined by a main surface 206 and a rear surface 208 that is opposite the main surface 206. A thickness of the semiconductor dies 202 can be defined as a distance between the main and rear surfaces 206, 208 of the semiconductor body 204 in a direction perpendicular to these surfaces 206, 208.

The wafer 200 and the dies 202 each include first electrically conductive terminals 210 arranged on the main surface 206. For example, the wafer 100 and the dies 202 may each include bonding pads formed from copper, aluminum or other electrically conductive metals.

Each of the semiconductor dies 202 include functional devices integrated in the semiconductor body 204. These functional devices may be any of a variety of functional devices, such as, MOSFETs, BJTs, diodes, etc. Further, these functional devices may have any one of a variety of orientations, relative to the semiconductor body 204. For example, the functional devices may be configured to conduct in a direction parallel to the main surface 206 (i.e., as lateral devices) or in a direction perpendicular to the main surface 206 (i.e., as vertical devices).

The first terminals 210 of the semiconductor dies 202 are connected to the functional devices and provide input/output access to the functional devices. Further, the semiconductor dies 202 include solder balls 216 formed on the first surface 206 and in electrical contact with the first terminals 210. In other words, the semiconductor dies 202 are configured as flip-chips that can each be individually mated with a unit-cell of the wafer 200.

The wafer 200 includes second electrically conductive terminals 212 arranged on a rear surface 208 that is opposite from the main surface 206 of the wafer 200. The second terminals 212 are electrically connected to the first terminals 210 of the wafer 200 by electrical connectors 214 that are arranged within the semiconductor body 204 of the wafer 200. That is, the wafer 200 is configured to provide an electrical conduit between first terminal 210 of the wafer 200, which is on the main surface 206, and the second terminal 212 of the wafer 200, which is on the rear surface 208. According to an embodiment, the electrical connector 214 is configured as a through-silicon-via (TSV).

The wafer 200 may include, but does not necessarily include, functional devices integrated into the semiconductor body 204. For example, the wafer 200 may be configured as a purely passive device in which the electrical connector 214 is a passive wire connection formed within a bulk semiconductor material that is devoid of any intentionally formed active devices. Alternatively, the electrical connector 214 may be provided by a functional device, such as vertical transistor, in the semiconductor body 204 of the wafer 200. In addition or in the alternative, the wafer 200 may include one or more active components, such as MOSFETs, BJTs, diodes, etc., in addition to the electrical connectors 214.

The wafer 200 and the dies 202 are arranged with the respective main surfaces 206 of the semiconductor dies 202 facing the main surface 206 of the wafer 200. That is, the wafer 200 and the dies 202 are arranged in a flip-chip configuration such that the first terminals 210 of the wafer 200 and the dies 202 face one another and such that the second electrically conductive terminals 212 of the wafer 200 face away from the semiconductor dies 202.

Figure 8:
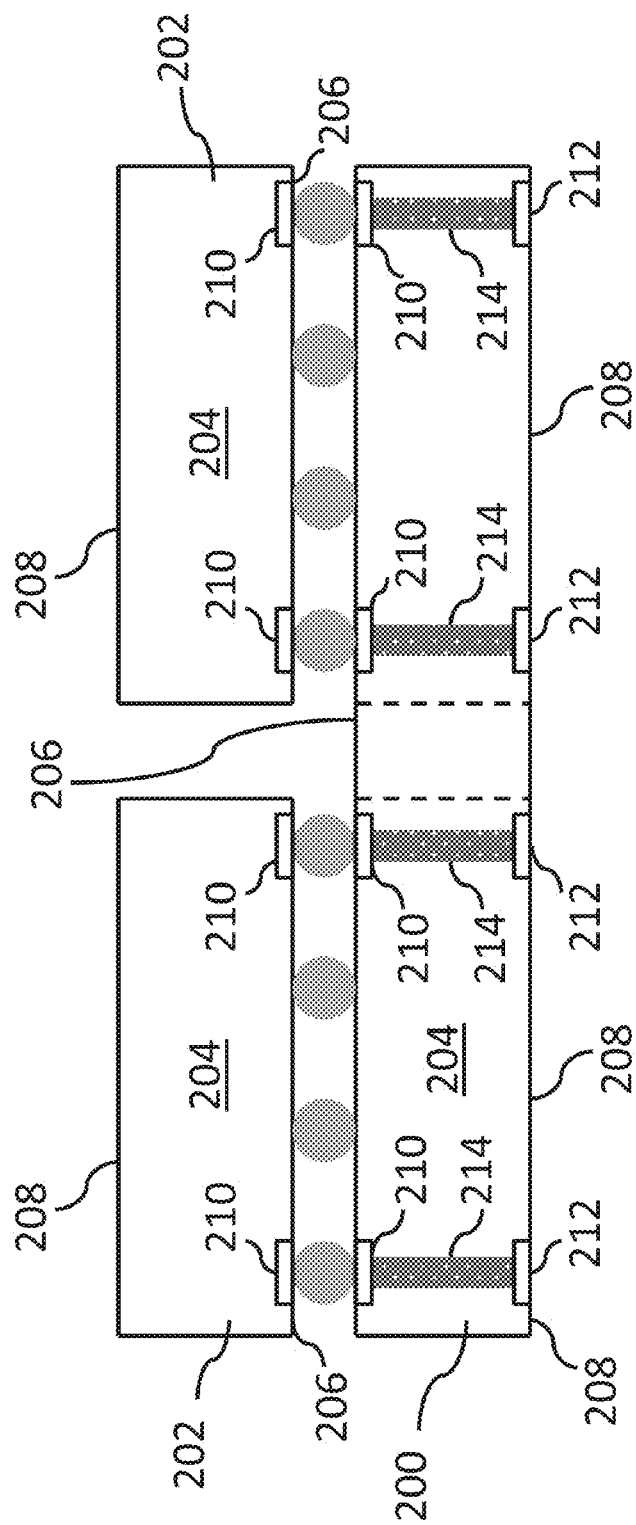
FIG. 8 depicts permanently attaching the wafer of FIG. 7 to each of the semiconductor dies, according to an embodiment.

Referring to FIG. 8, each of the semiconductor dies 202 in the plurality are permanently attached to the wafer 200 such that the first terminals 210 of the semiconductor dies 202 are electrically connected to the first terminals 210 of the semiconductor wafer, e.g., by soldering the respective first terminals 210 of the semiconductor dies 202 and the wafer together using the solder balls 216.

Figure 9:
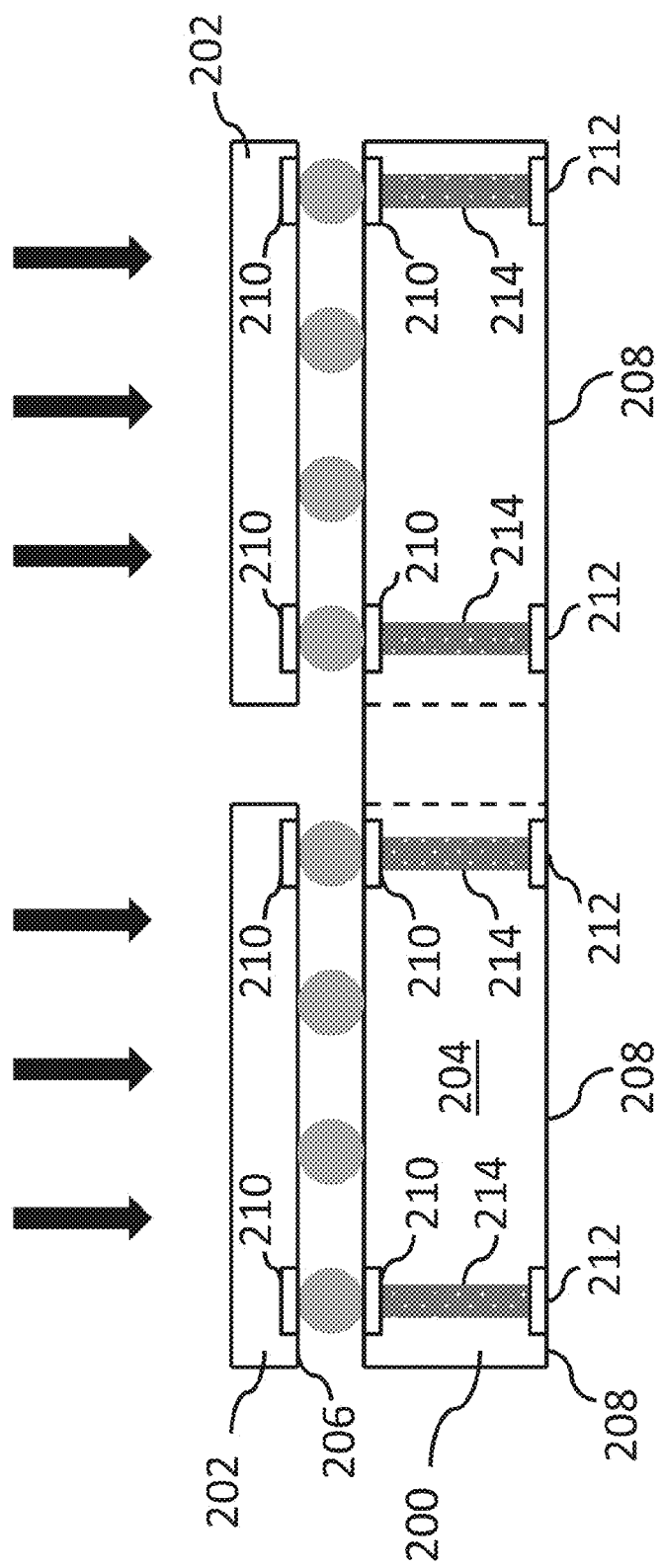
FIG. 9 depicts thinning the semiconductor dies of FIG. 7, according to an embodiment.

Referring to FIG. 9, each of the semiconductor dies 202 in the plurality is thinned. This may be done using the same techniques used to thin the semiconductor wafer 100 as described with reference to FIG. 3. For example, each of the semiconductor dies 202 may be thinned by grinding or plasma etching semiconductor material away from the rear surfaces 208 of the semiconductor dies 202 after permanently attaching the wafer 200 and before dicing the wafer 200. The semiconductor dies 202 may have a thickness of at least 200 μm before thinning and may have a thickness of less than or equal to 40 μm after thinning.

Figure 10:
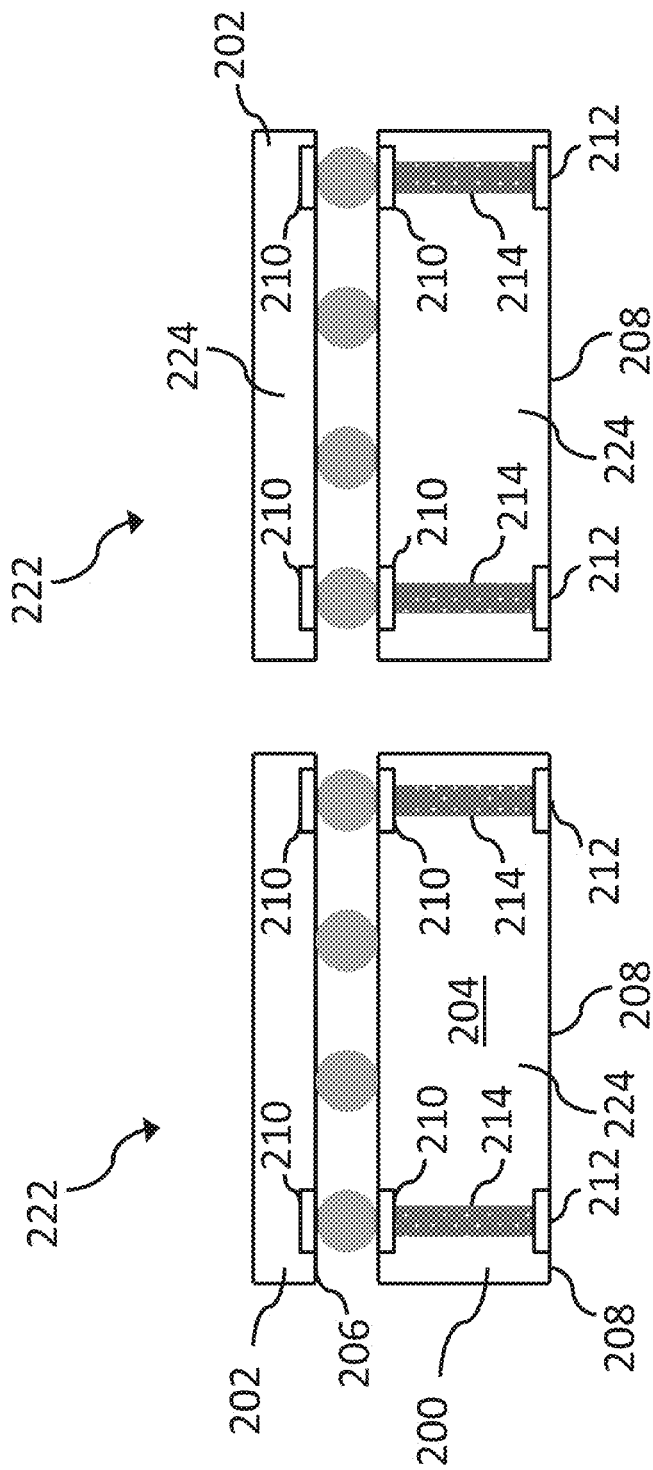
FIG. 10 depicts dicing the wafer of FIG. 7 after permanently attaching so as to form a plurality of chip-stacks, according to an embodiment.

Referring to FIG. 10, the wafer 200 is diced after permanently attaching so as to form a plurality of chip-stacks 222, with each of the chip-stacks 222 including one of the semiconductor dies 202 permanently attached to a diced wafer chip 224. The wafer 200 may be diced according to the techniques previously described, e.g., by scribing and breaking, sawing or laser cutting, etc.

The chip-stack 222 that is formed by the method steps of FIGS. 7-10 may be essentially indistinguishable from the chip-stack 122 that is formed from the method described with reference to FIGS. 1-6. That is, the chip-stack 222 includes a thinner semiconductor chip (i.e., the diced wafer chip 124 in the embodiment of FIGS. 1-6 or the semiconductor die 202 in the embodiment of FIGS. 7-10) that includes a functional device arranged in the semiconductor body 104 or 204 and a thicker semiconductor chip (i.e., the semiconductor die 102 in the embodiment of FIGS. 1-6 or the diced wafer chip 224 in the embodiment of FIGS. 7-10) having an electrical connector 114 or 214 that is internal to the semiconductor body 104 or 204 of the thicker semiconductor chip that is connected to the first and second terminals 110, 112 or 210, 212 of the thicker semiconductor chip. Further, in either one of the chip stacks 122 or 222, at least one of the first terminals 110 or 210 of the thinner semiconductor chip is electrically accessible by the second terminal 112 or 212 of the second semiconductor chip.

Figure 11:
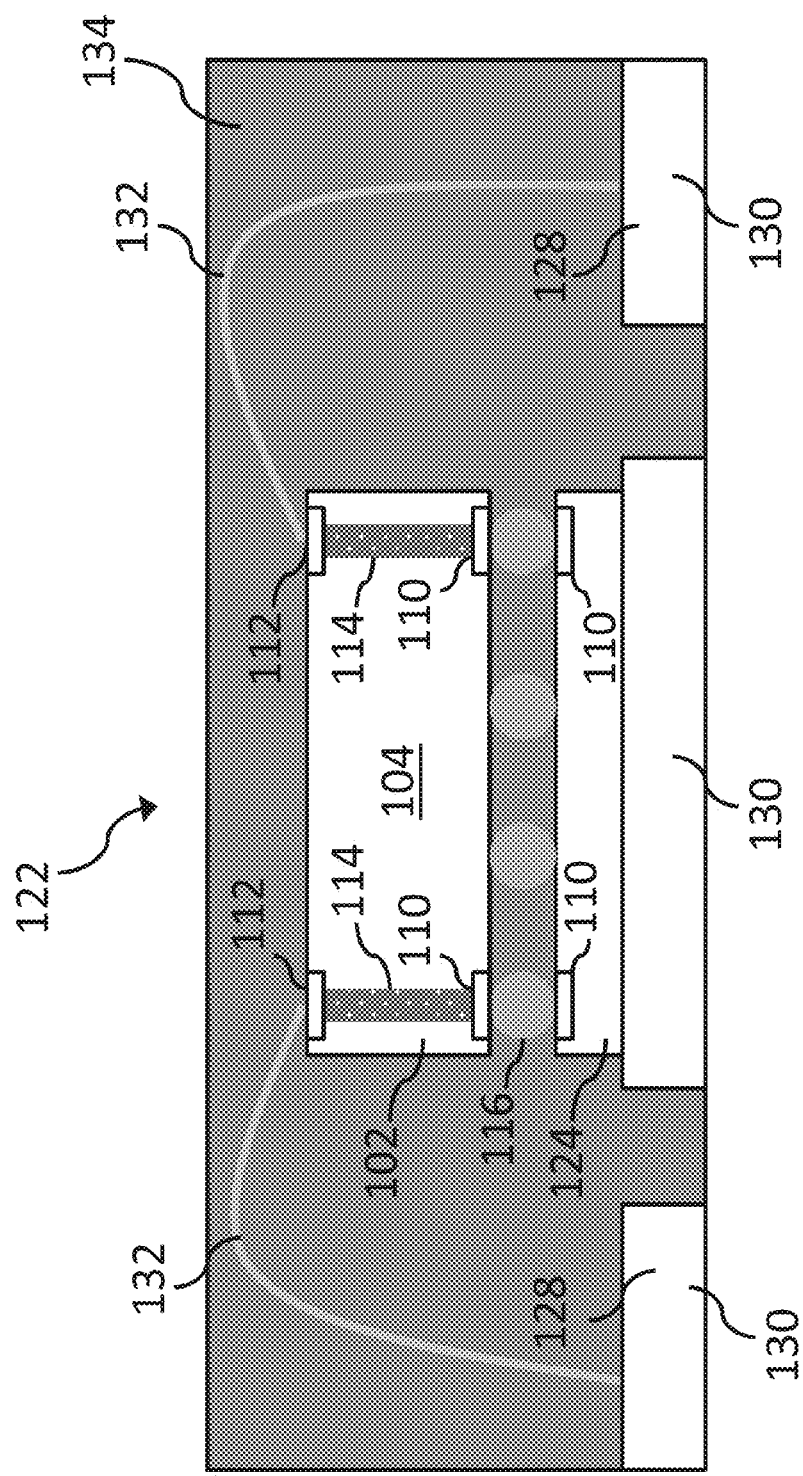
FIG. 11 depicts a method of packaging a chip-stack, according to an embodiment.
Figure 12:
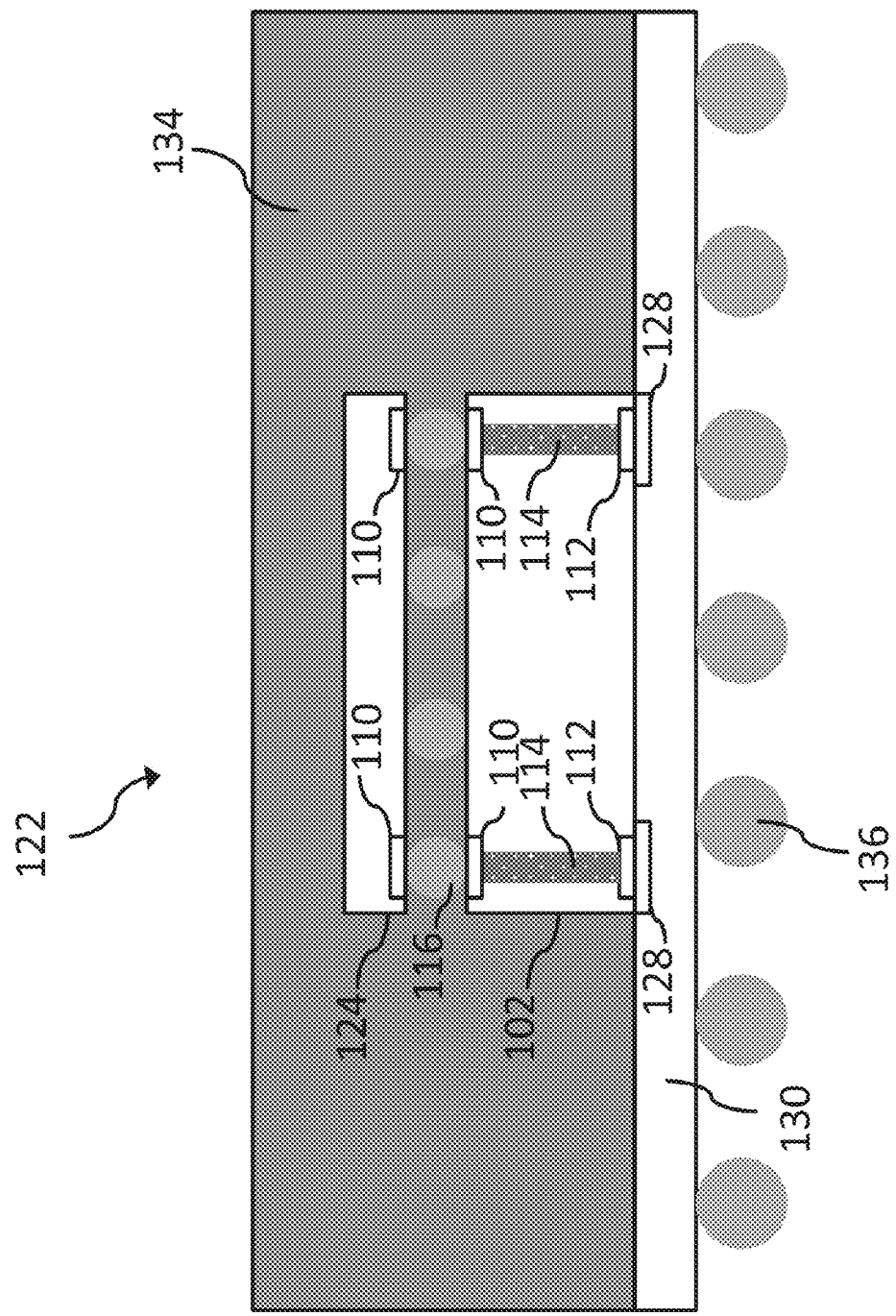
FIG. 12 depicts a method of packaging a chip-stack, according to another embodiment.
Figure 13:
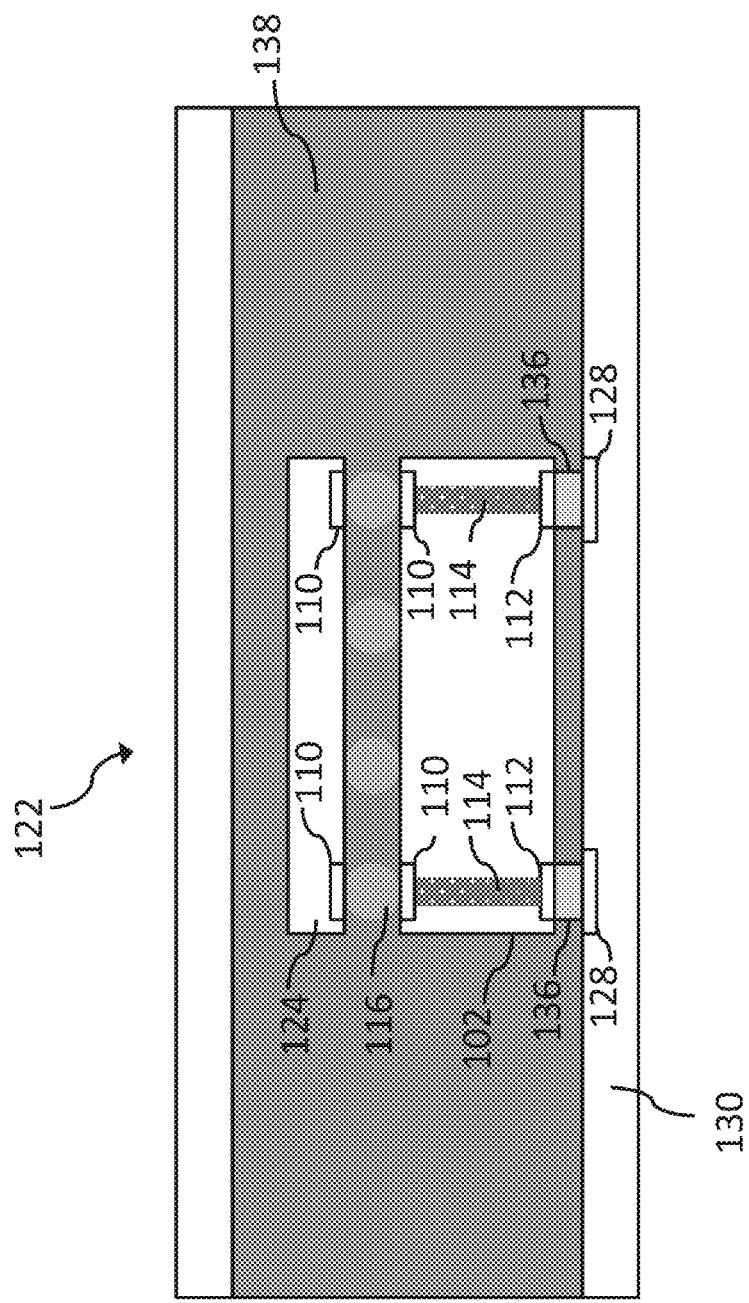
FIG. 13 depicts a method of packaging a chip-stack, according to yet another embodiment.

FIGS. 11-13 illustrate various methods of packaging either one of the chip-stacks 122, 222. The chip-stack 122 is packaged by electrically connecting the second terminal 112 of the chip-stack 122 to a package-level terminal 128, such as a lead or trace. Thus, an electrical connection is formed between the package-level terminal 128 and the first terminal 110 of the thinner semiconductor chip 124, which includes the functional device. For example, the chip-stack 122 may be configured such that the diced wafer chip 124 includes a functional device and the second terminal 112 is arranged on a rear surface 208 of the semiconductor die 102. Thus, electrically connecting the package-level terminal 128 to the second terminal 112 of the chip stack 122 electrically connects the package-level terminal 128 to one of the first terminals of the diced wafer chip 124, due to the electrically conductive connection provided by the electrical connector 114 and the solder between the respective first terminals 110.

In the embodiment of FIG. 11, the chip-stack 122 is packaged using a lead frame and wire bonding technique. More particularly, a lead-frame 130 is provided. The lead-frame 130 may be any conventionally known lead-frame, with a plurality of electrically conductive leads that form the package-level terminals 128. The chip stack 122 is arranged on the lead frame 130 such that the thinner semiconductor chip having the functional device (i.e., the diced wafer chip 124 in the depicted embodiment) faces and contacts the lead-frame 130. The second terminals 112 of the chip-stack 122, which are provided on the rear surface 108 of the thicker semiconductor chip (i.e., the semiconductor die 102 in the depicted embodiment) faces away from the lead-frame 130. A bonding wire 132 is provided between the lead of the lead-frame 130 and the second terminal 112 of the chip stack. The bonding wire 132 is electrically connected to the terminals 128, 112, e.g., by soldering. Subsequently, the chip-stack 122 is encapsulated with an electrically insulating material 134. For example, the chip-stack 122 may be encapsulated by an epoxy or plastic using an injection or transfer molding process.

In the embodiments of FIGS. 12 and 13, the chip-stack 122 is arranged oppositely as the embodiment of FIG. 11 such that the second terminals 112 directly face the package-level terminals 128, which are provided by an electrically conductive substrate 130. The chip-stack 122 is arranged on or over the substrate 130 such that the thinner chip having the functional device (i.e., the diced wafer chip 124 in the depicted embodiment) faces away from the substrate 130 and such that the second terminals 112 face the substrate.

According to the embodiment of FIG. 12, the substrate 130 is configured as a redistribution layer (RDL). The redistribution layer is configured such that the package-level terminals 128 are compatible with the geometry of the second terminals 112 of the chip stack 122. An electrical connection between the second terminals 112 and the package-level terminals 128 may be formed, e.g., by soldering. The package-level terminals 128 may be further connected to terminals at a rear side of the redistribution layer. The rear side of the redistribution layer is configured with solder bumps 136, which allow for electrical connection to an external device. After forming the electrically conductive connection, the chip-stack 122 is encapsulated with an electrically insulating material. For example, the chip-stack 122 may be encapsulated by an epoxy or plastic using an injection or transfer molding process.

FIG. 13 depicts an embodiment in which the chip-stack 122 is directly mounted on a printed-circuit board (PCB). In this configuration, the electrically conductive substrate 130 is the printed-circuit board. The second terminals 112 are electrically connected to the package-level terminals 128 by an intermediate conductive structure 136, which may be solder or any conductive metal, such as copper, aluminum, etc. After forming the electrically conductive connection, the chip-stack 122 can be encapsulated by a printed-circuit board laminate material 138.

As used herein, a "permanent attachment" exists if the semiconductor dies and the wafer are physically coupled to one another by a structure that is not configured to release the two upon the application of mechanical force. For example, the wafer may be permanently attached to each of the semiconductor dies by soldering the dies and the wafer together. Although the solder connection may be broken with excessive amounts of mechanical force, the solder will not necessarily break at predictable locations, and damage to the solder and/or the wafer and dies may occur in the process. This is considered a "permanent attachment," within the meaning of the present Specification. By contrast, tapes or compounds that provide a temporary bond that can later be broken along a predictable plane (e.g., adhesive tape or dicing tape) upon the application of mechanical force do not provide a "permanent attachment," within the meaning of the present Specification.

As used herein, a "flip-chip" refers to a semiconductor chip that is electrically connectable to an external device without the need for extrinsic electrical connectors, such as bonding wires. For example, the terminals of a flip-chip may include pre-fabricated solder bumps or solder balls that can be mated and electrically connected to the terminals of an external device (e.g., chip, printed circuit board, etc.) by the application of heat. Optionally, the flip-chip may include further terminals on a rear side, e.g., in the case of a vertical device configuration.

As used herein, a through-silicon-via (TSV) refers to any conductive structure that provides electrical connectivity between two opposite surfaces of a semiconductor chip. The electrical connector may be formed from any electrically conductive material that is possible in semiconductor technology, such as copper, aluminum, polysilicon, etc.

As used herein, the term "electrically connected" describes a permanent low-ohmic connection between electrically connected elements, for example a direct contact between the concerned elements or a low-ohmic connection via a metal and/or highly doped semiconductor. By contrast, elements that are electrically coupled may include one or more intervening element(s) adapted for signal transmission existing between the electrically coupled elements, for example elements that temporarily provide a low-ohmic connection in a first state and a high-ohmic electric decoupling in a second state.

Spatially relative terms such as "under," "below," "lower," "over," "upper" and the like, are used for ease of description to explain the positioning of one element relative to a second element. These terms are intended to encompass different orientations of the device 100 in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of processing a wafer and plurality semiconductor dies, with either the wafer or the semiconductor dies being configured as a flip-chip, the method comprising:
    permanently attaching the wafer to each of the semiconductor dies in a flip-chip configuration such that main surfaces of the semiconductor dies face a main surface of the wafer and such that first terminals of the semiconductor dies are electrically connected to first terminals of the semiconductor wafer;
    thinning at least one of: the wafer, and each of the semiconductor dies;
    dicing the wafer after permanently attaching so as to form a plurality of chip-stacks, each of the chip-stacks comprising one of the semiconductor dies and a diced wafer chip; and
    packaging the chip-stacks, wherein packaging comprises:
        electrically connecting a package-level terminal to a second terminal of the chip-stack, the second terminal being arranged on a rear surface that is opposite to one of the main surfaces in the chip-stack and being connected to one of the first terminals in the chip-stack by an electrical connector that is internal to a semiconductor body of either the semiconductor die or the diced wafer chip of the chip-stack; and
        encapsulating the chip-stack with an electrically insulating material,
    wherein either the wafer comprises a plurality of functional devices and the dies are passive devices, or the wafer is a passive device and the dies each comprise a plurality of functional devices, and
    wherein thinning at least one of: the wafer, and each of the semiconductor dies comprises thinning the semiconductor body of either of the wafer or the semiconductor dies that comprise the functional devices.

2. The method of claim 1, wherein, in each chip-stack, the diced wafer chip comprises a functional device and the second connector is arranged on a rear surface of the semiconductor die, and wherein electrically connecting the package-level terminal to the second terminal of the chip-stack electrically connects the package-level terminal to one of the first terminals of the diced wafer chip.

3. The method of claim 1, wherein, in each chip-stack, the semiconductor die comprises a functional device and the second connector is arranged on a rear surface of the diced wafer chip, and wherein electrically connecting the package-level terminal to the second terminal of the chip-stack electrically connects the package-level terminal to one of the first terminals of the semiconductor die.

4. The method of claim 1, and wherein packaging the chip-stacks comprises:
providing a lead-frame;
arranging the chip-stack on the lead-frame such that the semiconductor die or diced wafer chip having the functional device faces and contacts the lead-frame and such that second terminal of the chip-stack faces away from the lead-frame; and
forming a bonding wire that extends between a lead of the lead-frame and the second terminal.

5. The method of claim 1, and wherein packaging the chip-stacks comprises:
providing an electrically conductive substrate;
arranging the chip-stack on the substrate such that the semiconductor die or diced wafer chip having the functional device faces away from the substrate and such that the second terminal faces the substrate; and
electrically connecting the substrate to the second terminal.

6. The method of claim 1, further comprising handling, using a robotic arm, either the wafer or each of the semiconductor dies that is not thinned after thinning an opposite facing one of the wafer, and each of the semiconductor dies.

7. A method of forming a semiconductor device, the method comprising:
providing a semiconductor wafer and a plurality of semiconductor dies, the wafer and the dies each comprising first electrically conductive terminals arranged on a main surface;
permanently attaching the wafer to each of the semiconductor dies, with the respective main surfaces of the semiconductor dies facing the main surface of the wafer, such that the first terminals of the semiconductor dies are electrically connected to the first terminals of the semiconductor wafer;
thinning at least one of: the wafer, and each of the semiconductor dies; and
dicing the wafer after permanently attaching so as to form a plurality of chip-stacks, each of the chip-stacks comprising one of the semiconductor dies permanently attached to a diced wafer chip,
wherein at least one of the first terminals in the chip-stack is accessible by a second electrically conductive terminal arranged on a rear surface that is opposite to one of the main surfaces in the chip-stack, the second terminal being electrically connected to the at least one of the first terminals by an electrical connector—that is internal to a semiconductor body of either the semiconductor die or the diced wafer chip of the chip-stack,
wherein either the wafer comprises a plurality of functional devices and the dies are passive devices, or the wafer is a passive device and the dies each comprise a plurality of functional devices, and
wherein thinning at least one of: the wafer, and each of the semiconductor dies comprises thinning the semiconductor body of either of the wafer or the semiconductor dies that comprise the functional devices.

8. The method of claim 7, wherein the electrical connector that is internal to a semiconductor body is a through-silicon-via.

9. The method of claim 7, wherein the wafer is permanently attached to each of the semiconductor dies by soldering the first terminals of the semiconductor dies to the first terminals of the semiconductor wafer, and wherein soldering the first terminals electrically connects a functional device that is within the wafer or the semiconductor dies to the second terminal.

10. The method of claim 7, further comprising handling, using a robotic arm, either the wafer or each of the semiconductor dies that is not thinned after thinning an opposite facing one of the wafer, and each of the semiconductor dies.

11. The method of claim 7, wherein each of the semiconductor dies in the plurality comprise one or more functional devices, and wherein, in the chip-stack, one of the first terminals of the semiconductor die is accessible by the second electrically conductive terminal.

12. The method of claim 11, wherein the second terminal is arranged on the rear surface of the diced wafer chip, and wherein the electrical connector is arranged within the diced wafer chip and connects the second terminal to one of the first terminals of the diced wafer chip and the semiconductor die in the chip-stack.

13. The method of claim 7, wherein the wafer comprises a plurality of functional devices, and wherein, in the chip-stack, one of the first terminals of the diced wafer chip is accessible by the second electrically conductive terminal.

14. The method of claim 13, wherein the second terminal is arranged on the rear surface of the semiconductor die, and wherein the electrical connector is arranged within the semiconductor die and connects the second terminal to one of the first terminals of the semiconductor die and the diced wafer chip in the chip-stack.

15. The method of claim 13, wherein each of the semiconductor dies in the plurality is thinned by grinding or plasma etching semiconductor material away from the rear surfaces of the semiconductor dies after permanently attaching the wafer and before dicing the wafer, wherein each of the semiconductor dies have a thickness of at least 200 μm before thinning, and wherein each of the semiconductor dies in the plurality have a thickness of less than or equal to 40 μm after thinning, the thickness of the semiconductor dies being measured between the main and rear surfaces of each semiconductor die.

16. The method of claim 13, wherein the wafer is thinned by grinding or plasma etching semiconductor material away from a rear surface of the wafer before dicing the wafer, wherein the wafer has a thickness of at least 200 μm before thinning, and wherein the wafer has a thickness of less than or equal to 40 μm after thinning, the thickness of the wafer being measured between the main and rear surfaces of the wafer.

17. The method of claim 16, wherein the wafer is thinned after permanently attaching the wafer to each of the semiconductor dies.

18. The method of claim 16, wherein the wafer is thinned before permanently attaching the wafer to each of the semiconductor dies.

* * * * *